(12) United States Patent
Ma

(10) Patent No.: US 7,658,634 B2
(45) Date of Patent: Feb. 9, 2010

(54) ZERO INSERTION FORCE CONNECTOR WITH AN IMPROVED DRIVER MEMBER

(75) Inventor: Hao-Yun Ma, Tu-Cheng (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 23 days.

(21) Appl. No.: 11/980,892

(22) Filed: Oct. 31, 2007

(65) Prior Publication Data

US 2008/0102681 A1 May 1, 2008

(51) Int. Cl.
*H01R 4/50* (2006.01)

(52) U.S. Cl. ................................... 439/342

(58) Field of Classification Search ............... 439/342, 439/259–266, 68
See application file for complete search history.

(56) References Cited

U.S. PATENT DOCUMENTS

| 6,340,309 | B1 | 1/2002 | Lin et al. | |
|---|---|---|---|---|
| 6,431,900 | B1 | 8/2002 | Yu et al. | |
| 6,692,281 | B1 * | 2/2004 | McClinton et al. | 439/342 |
| 7,056,140 | B1 * | 6/2006 | Jiang | 439/342 |

* cited by examiner

*Primary Examiner*—Renee Luebke
*Assistant Examiner*—Larisa Tsukerman
(74) *Attorney, Agent, or Firm*—Andrew C. Cheng; Wei Te Chung; Ming Chieh Chang

(57) ABSTRACT

An electrical connector (1) for connecting an IC package to a printed circuit board (PCB) comprises an insulating base (10) arranged a plurality of terminals therein, a cover (11) moveable assembly on the base and a driver mechanism disposed on the insulating base and driving the cover to slide relatively to the insulating base. The driver at least comprises a hollow driver member (12) and the driver member (12) is rotated by an exterior force.

13 Claims, 7 Drawing Sheets

ZERO INSERTION FORCE CONNECTOR WITH AN IMPROVED DRIVER MEMBER

BACKGROUND OF THE INVENTION

1. Field of the Invention

The present invention relates to a zero insertion force (ZIF) connector, and particularly to a connector having a driving device drives a cover sliding on a base.

2. Description of the Prior Art

U.S. Pat. No. 6,340,309 issued to Lin et al. on Jan. 22, 2002 and U.S. Pat. No. 6,431,900 issued to Yu on Aug. 13, 2002 both disclose a conventional ZIF connector including a base housing, a cover movable on the base housing and a cam driver locating between the base housing and the cover. The cam driver is in a solid structure and can drive the cover to slide on the base housing, which will realize a zero insertion force for the IC package.

However, the solid cam driver needs a large amount of material to make of, which is disadvantage for cost-down. More, the cam driver has a high probability of defective and leads to poor production efficiency in production. Hence, a new design which can overcome the problem is required.

SUMMARY OF THE INVENTION

Accordingly, an object of the present invention is to provide an electrical connector with an improved driver mechanism.

In order to achieve the object set forth, an electrical connector for connecting an IC package to a printed circuit board (PCB) comprises: an insulating base arranged a plurality of terminals therein; a cover moveably assembled on the base; and a driver mechanism disposed on the insulating base and driving the cover to slide relatively to the insulating base; wherein the driver mechanism at least comprises a hollow driver member, the driver member is rotated by an exterior force.

Other objects, advantages and novel features of the invention will become more apparent from the following detailed description of the present embodiment when taken in conjunction with the accompanying drawings.

DETAILED DESCRIPTION OF THE INVENTION

Figure 1:
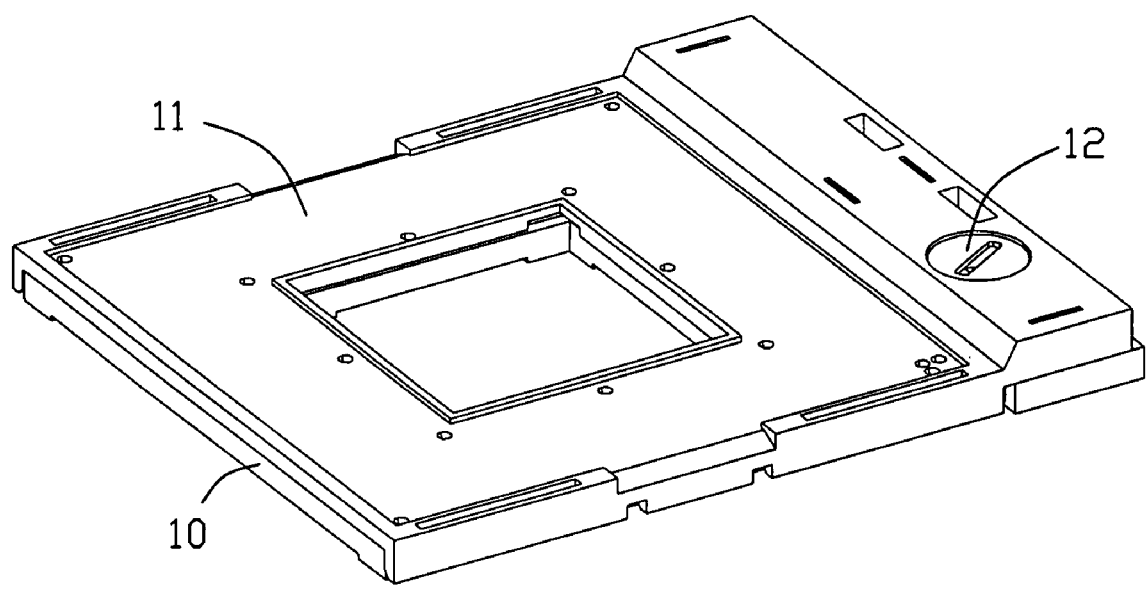
FIG. 1 is an assembled perspective view of an electrical connector in accordance with the present invention.

Reference will now be made to the drawing figures to describe a preferred embodiment of the present invention in detail.

Figure 2:
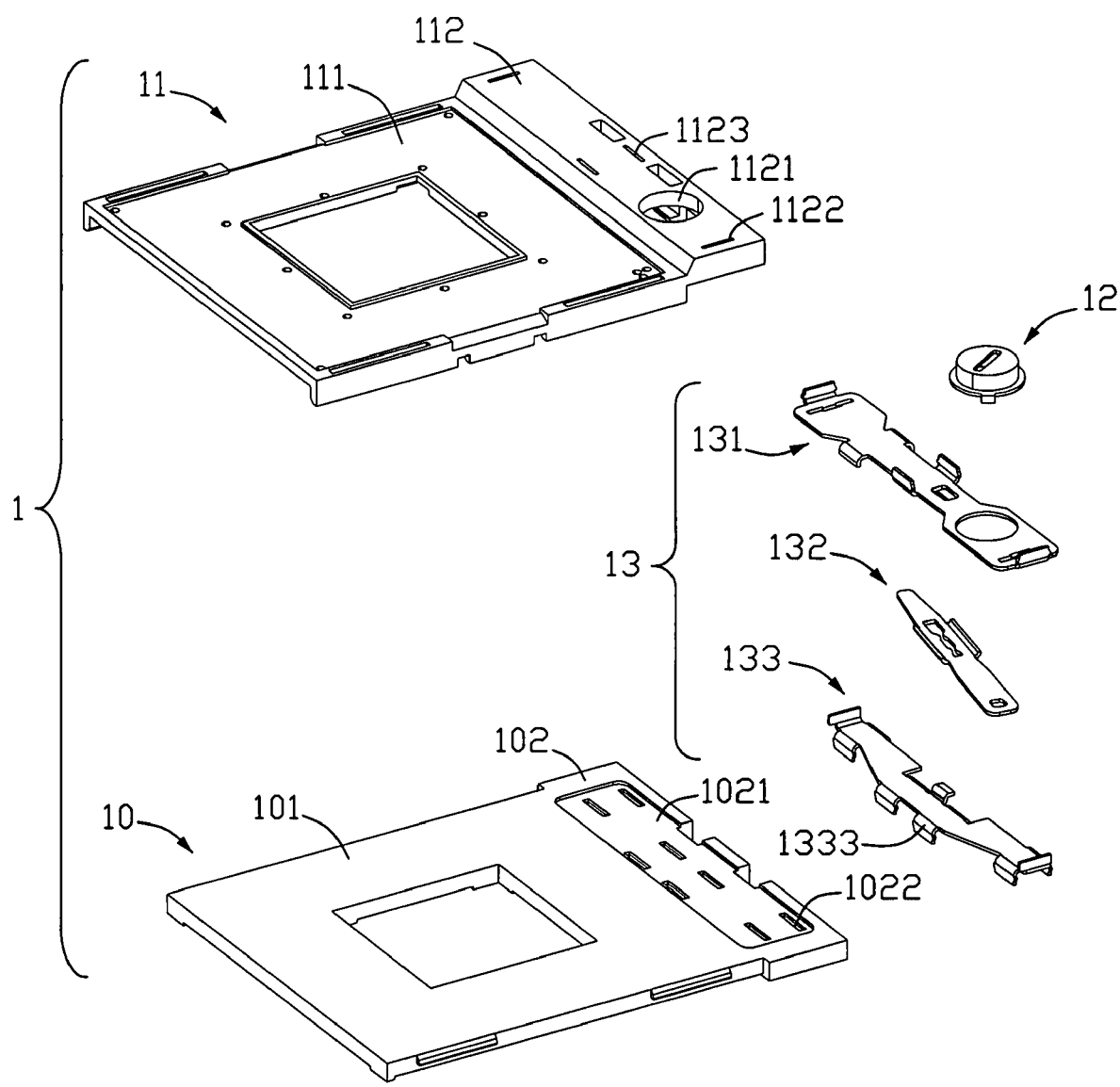
FIG. 2 is an exploded perspective view of the electrical connector shown in FIG. 1.

Referring to FIGS. 1 and 2, a ZIF connector 1 in accordance with the present invention is adapted for electrically connecting an IC package such as a CPU to a printed circuit board (PCB). The ZIF connector 1 comprises an insulating base 10, an insulating cover 11 movable assembled on the insulating base 10 and a driver mechanism locating between the insulating base 10 and the cover 11.

As shown in FIG. 2, the insulating base 10 has a rectangular shape and comprises a base portion 101 with a plurality of terminals (not shown) received therein and a supporting portion 102 extending forward from one end of the base portion 101. A sinking receiving recess 1021 in a rectangular shape is defined in the supporting portion 102 with a plurality of slots 1022 defined therein.

The cover 11 comprises a main body 111 and a head portion 112 extending from one end of the main body 111. The main body 111 and the head portion 112 are respectively cooperating with the base portion 101 and supporting portion 102 of the insulating base. And a space is defined between the head portion 112 and the supporting portion 102 to receive the driver mechanism. The main body 111 defines a plurality of holes corresponding with the terminals retained in the base portion 101 for receiving pins of the IC package when the IC package is installed. A circle opening 1121 is defined adjacent to one end of the head portion 112. A pair of transverse grooves 1122 are respectively defined at opposite ends of the head portion 112 and a pair of longitudinal grooves 1123 perpendicular to the transverse grooves 1122 are defined at opposite edges of a middle portion of the head portion 112.

Figure 3:
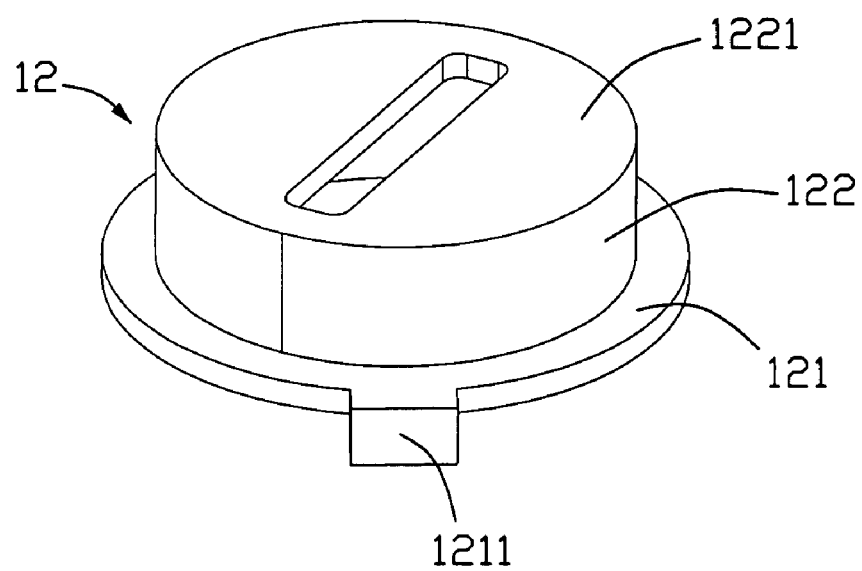
FIG. 3 is a perspective view of a driver member of the electrical connector shown in FIG. 2.
Figure 4:
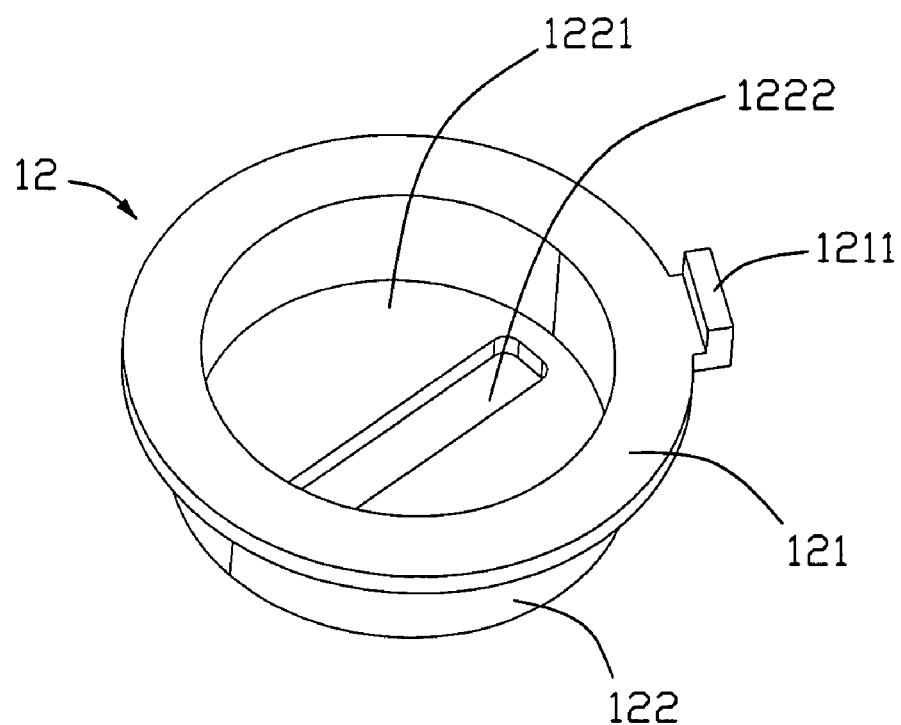
FIG. 4 is another view of the driver member shown in FIG. 3.

The driver mechanism comprises a driver member 12 and a an affiliated device 13 which comprises a series of parts cooperating with the driver member 12. See FIGS. 3 and 4, the driver member 12 is similar to a cap like and comprises a hollow cylindrical operating portion 122 and a circular brim portion 121. The brim portion 121 and the operating portion 122 are homocentric and the brim portion 121 is bigger than the operation portion 122 in dimension. A locking portion 1211 extends outward and then downward from an edge of the brim portion 121, which forms an adverse L shape. The driver member 12 is made by drawing a metal piece and forms the hollow structure with a top wall 1221 thereon, wherein the top wall defines an elongated slot 1222 for an operator to use.

Figure 5:
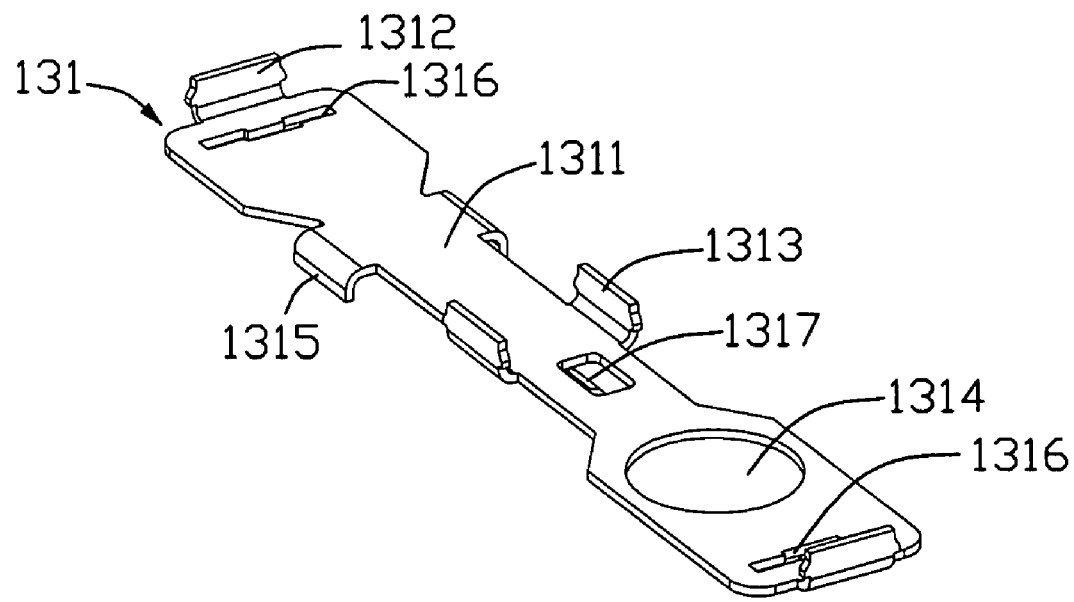
FIG. 5 is a perspective view of a first retaining plate of the electrical connector shown in FIG. 2.
Figure 7:
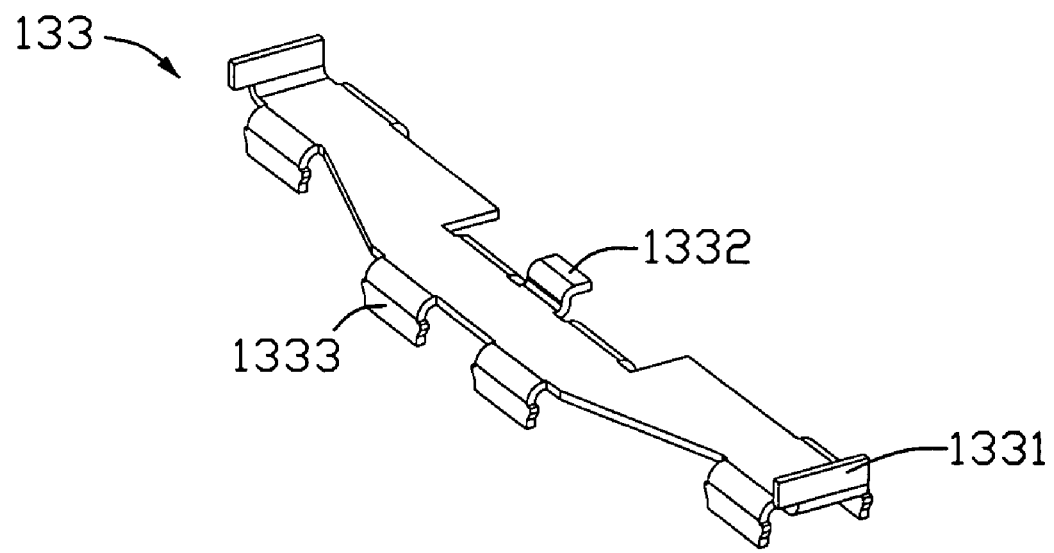
FIG. 7 is a perspective view of a second retaining plate of the electrical connector shown in FIG. 2.
Figure 6:
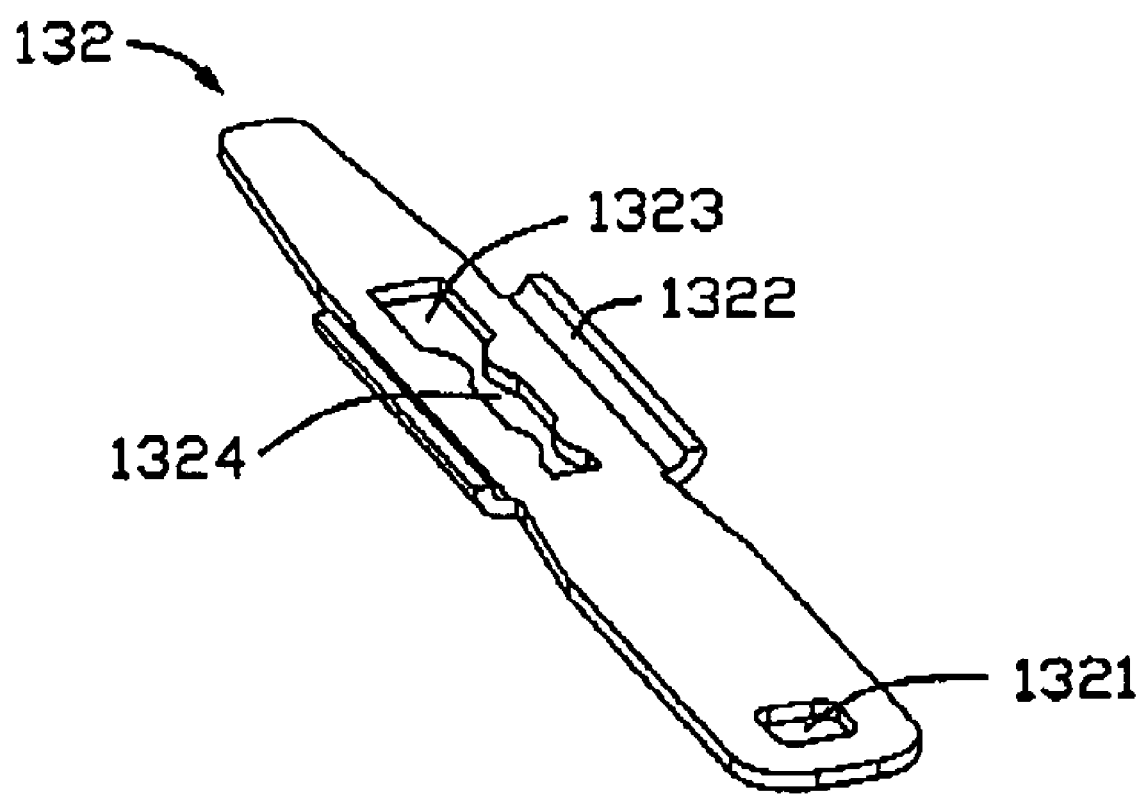
FIG. 6 is a perspective view of a connecting member of the electrical connector shown in FIG. 2.

Referring to FIG. 5 to FIG. 7, the affiliated device 13 comprises a first retaining plate 131, a connecting member 132 and a second retaining plate 133. See FIG. 5, the first retaining plate 131 is in an elongated shape with a plurality of bending portions and openings. A pair of first bending portions 1312 are bent upwardly from opposite ends of the first retaining plate 131 and a pair of second bending portions 1313 extend upwardly in middle of opposite lateral sides of the first retaining plate 131. A pair of stopping portions 1315 extend downwards from opposite lateral sides of the first retaining plate 131. A first locking portion 1317 extends downwardly from centre of the first retaining plate 131. The first retaining plate 131 further defines a pair of receiving slots 1316 at two longitudinal ends thereof and a circle hole 1314 is defined between the first locking portion 1317 and the receiving slot 1316.

Referring to FIG. 6, the connecting member 132 is in a wedge shape. The connecting member form a pair of third bending portions 1322 extending upwardly from opposite edges of a middle portion thereof. An irregular channel 1323 and an irregular gap 1324 are respectively defined between the third bending portions 1322, and the irregular channel 1323 is adjacent to a narrow end of the connecting member 132. At a wider end of the connecting member 132, a rectangular opening 1321 is defined to receive the locking portion 1211 of the driver member 12.

Referring to FIG. 7, the second retaining plate 133 comprises a plurality of holding portions 1333 extending downwardly to be inserted into the slots 1022 in the insulating base 10. A pair of fourth bending portions 1331 extend upwardly from opposite ends of the second retaining plate 133, and a second locking portion 1332 extends upwards from a middle portion of the second retaining plate 133, which is to be inserted into the irregular channel 1323.

Figure 8:
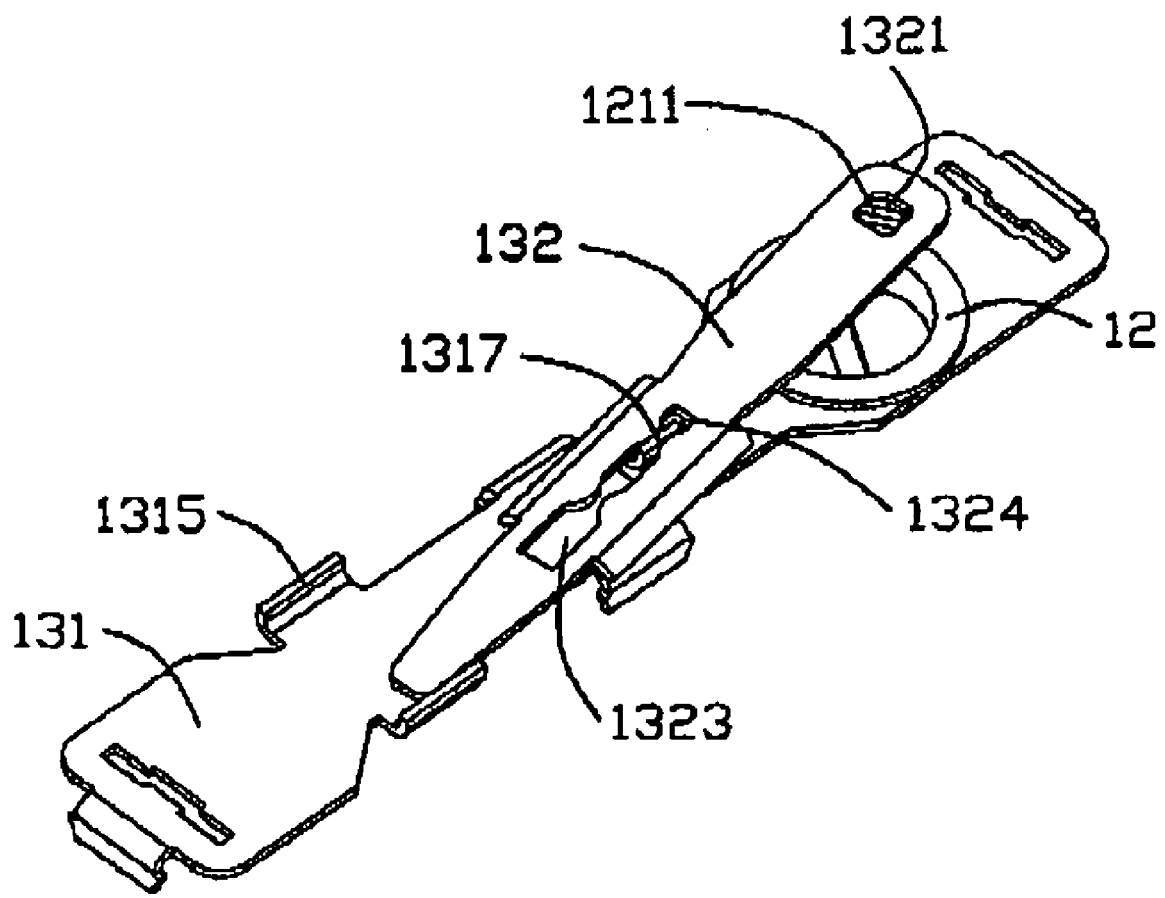
FIG. 8 is an assembled perspective view of a driver mechanism comprising the driver member, a first retaining plate and the connecting member shown in FIG. 2.
Figure 9:
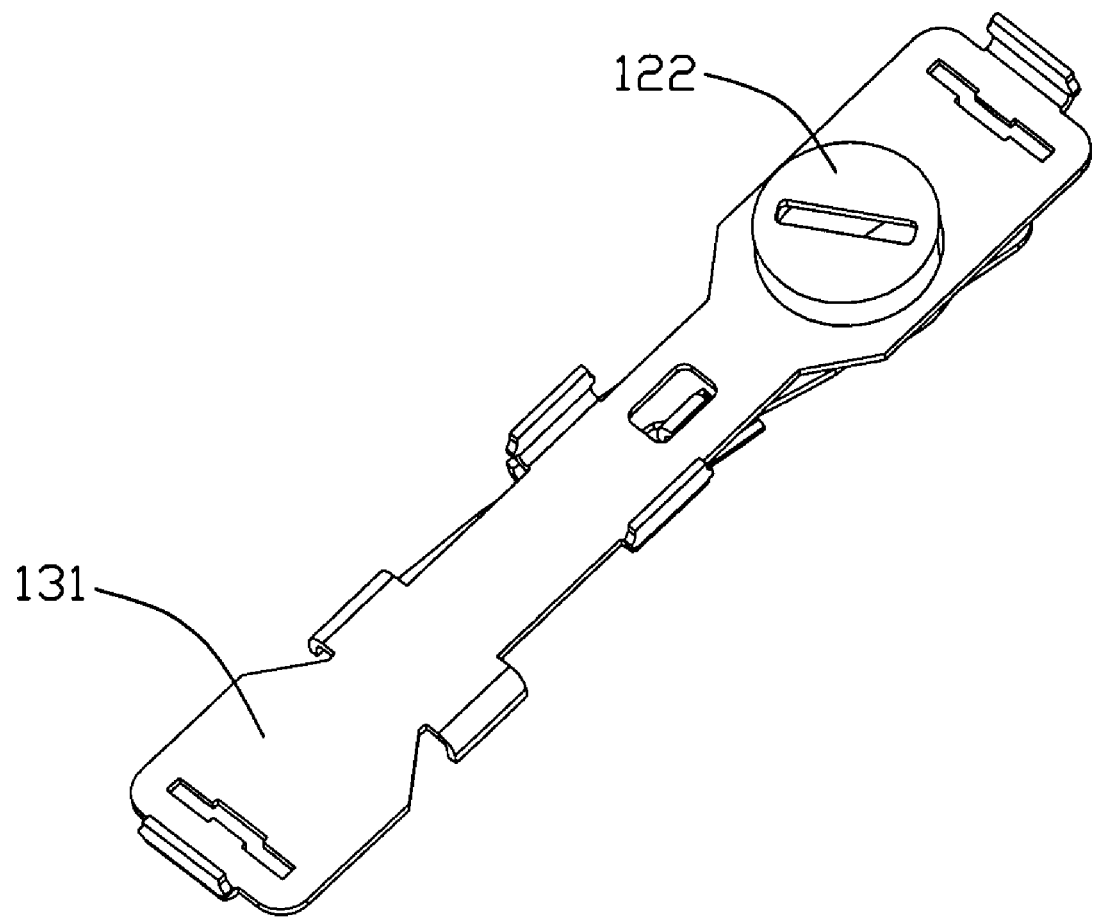
FIG. 9 is another view of the driver mechanism shown in FIG. 8.

Referring to FIGS. 8 and 9, the operating portion 122 of the driver member 12 goes through the circle hole 1314 from a bottom face of the first retaining plate 131 with the brim portion 121 being blocked by the first retaining plate 131. The connecting member 132 is attached to the driver member 12 by the rectangular opening 1321 being locked by the locking portion 1211. The first locking portion 1317 of the first retaining plate 131 is loosely received in the irregular gap 1324, therefore the connecting member 132 is controlled by the driver member 12 and rotated between the pair of stopping portions 1315. Then, combined with FIG. 2, the second retaining plate 133 is positioned in the receiving recess 1021 with holding portions 1333 retained in the slots 1022 in the insulating housing. The second locking portion 1332 and the pair of bending portions 1331 are respectively inserted into the irregular channel 1323 of the connecting member 132 and receiving slots 1316 of the first retaining plate 131, therefore the second retaining plate 133 is attached to and connecting with the connecting member 132 and the first retaining plate 131. Therefore, the driver mechanism is assembled on the base 10. When the cover 11 is assembled onto the base 10, the first and the second bending portions 1312, 1313 of the first retaining plate 131 are respectively retained in the transverse grooves 1122 and longitudinal grooves 1123, meanwhile the operating portion 122 is exposed to the circle opening 1121 of the cover 11.

FIG. 1 is a perspective view of the ZIF electrical connector after it is completely assembled. User can use a screwdriver (not shown) to operate the driver member 12, and the connecting member 132 is driven to urge the stopping portions 1315 to move forward or backward, which will actuate the cover 11 to move in a front-to-back direction. As the first retaining plate 131 and the second retaining plate 133 are respectively fixed in the cover 11 and the base 10, a reliable relatively moving between the cover 11 and the base 10 will be produced by the connecting member 132. The rectangular opening 1321, the irregular gap 1324 and the irregular channel 1323 are respectively defined as first, second and third positions of the connecting member 132, therefore, during the operating process, the third position 1323 is stationary with regard to the base 10 while said first and second positions are not; the second position 1322 is stationary with regard to the cover 11 while the first and third positions are not; the first position 1321 is stationary with regard to the driver member 12 while the second and third positions are not. It is noted that the connecting member 132 is essentially of an elongated piece and the first, second and third positions 1321, 1322 and 1323 are arranged to be spaced from one another along an elongated direction of said connecting member 132. It is also noted that the driver member 12 is essentially rotated around the first position 1321 while the connecting member 132 is pivotal about the second position 1322. The other work theory of the ZIF connector is common knowledge for people in the field, and further description will be omitted here.

In the present invention, the driver member 12 is configured as a hollow construction, which is advantage for decreasing the using material of each member and reducing the cost of each member. Furthermore, the present invention is not only adapted to the ZIF connector mentioned above, but also useful in other known ZIF connector.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector for connecting an IC package to a printed circuit board (PCB) comprising:
an insulating base arranged with a plurality of terminals mounted therein;
a cover moveably assembled on the base;
a driver mechanism disposed on the insulative base and driving the cover to slide relatively to the insulating base;
wherein the driver mechanism at least comprises a hollow driver member rotated by an exterior force and an affiliated device connected with the cover and the driver member, and the driver member shifts the affiliated device to urge the cover to slide with respect to the base;
wherein the affiliated device comprise a first retaining plate and a connecting member, the first retaining plate comprises a plurality of bending portions retained to the cover and the connecting member connects with the first retaining plate and the driver member;
wherein the affiliated device further comprises a second retaining plate forming thereon a plurality of holding portions retained to the base; and the second retaining plate is attached to the connecting member and the first retaining plate.

2. The electrical connector as described in claim 1, wherein the driver member has an operating portion exposed to an operator and a brim portion extending downwardly.

3. The electrical connector as described in claim 1, wherein the driver member has a top wall defining a slot therein for a tool to operate.

4. The electrical connector as described in claim 1, wherein the driver member is in a hollow column shape.

5. The electrical connector as described in claim 1, wherein the second retaining plate defines a pair of bending portions received in receiving slots defined on the first retaining plate and a locking portion received in a channel defined on the connecting member, therefore the connecting member is sandwiched between the first and the second retaining plates.

6. The electrical connector as described in claim 5, wherein the first retaining plate forms a pair of stopping portions facing the second retaining plate, one end of the connecting member is moved between the stopping portions by the driver member.

7. An electrical connector comprising:
an insulative base;
an insulative cover moveable relative to the base in a front-to-back direction;
a driver member associated with the cover;
a connecting member hidden between the cover and the base, and defining first, second and third positions respectively engaged with the driver member, the cover and the base correspondingly; wherein during rotation of the driver member, the connecting member will actuate the cover to move along said front-to-back direction;

wherein said base engages the connecting member via a retention plate retained to the base.

8. The connector as claimed in claim 7, wherein said second position is located between the first and the third positions.

9. The connector as claimed in claim 7, wherein said third position is stationary with regard to the base while said first and second positions are not.

10. The connector as claimed in claim 7, wherein second position is stationary with regard to the cover while the first and third positions are not.

11. The connector as claimed in claim 7, wherein the first position is stationary with regard to the driver member while the second and third positions are not.

12. The connector as claimed in claim 7, wherein said connecting member actuates the cover via another retention plate retained to the cover.

13. The connector as claimed in claim 12, wherein said another retention plate defines an through hole in which said driver member is received.

* * * * *